United States Patent [19]
Grotz et al.

[11] Patent Number: 5,638,073
[45] Date of Patent: Jun. 10, 1997

[54] METHOD OF LINEARIZING VARIATIONS IN THE TRANSFER CHARACTERISTIC OF A D/A CONVERTER, AS WELL AS AN ARRANGEMENT AND USE THEREOF

[75] Inventors: Karlheinz Grotz, Fellbach; Jörg Mayer, Stuttgart, both of Germany

[73] Assignee: ANT Nachrichtentechnik GmbH, Backnang, Germany

[21] Appl. No.: 395,592

[22] Filed: Feb. 28, 1995

[30] Foreign Application Priority Data

Mar. 11, 1994 [DE] Germany ............ 44 08 181.2

[51] Int. Cl.$^6$ ............................................ H03M 1/66
[52] U.S. Cl. ............................................ 341/144; 341/140
[58] Field of Search ............................. 341/144, 143, 341/118, 120, 140, 153

[56] References Cited

U.S. PATENT DOCUMENTS

| | | |
|---|---|---|
| 4,316,178 | 2/1982 | Shibayama et al. . |
| 4,340,882 | 7/1982 | Maio et al. . |
| 4,835,535 | 5/1989 | Shibayama et al. . |
| 5,457,714 | 10/1995 | Engel et al. .................... 375/247 |

FOREIGN PATENT DOCUMENTS

| | | |
|---|---|---|
| 0430449A2 | 6/1991 | European Pat. Off. . |
| 0447833A2 | 9/1991 | European Pat. Off. . |
| 0506079A1 | 9/1992 | European Pat. Off. . |
| 30 39 901 | 5/1981 | Germany . |
| 4003682 | 8/1991 | Germany . |
| WO90/14717 | 11/1990 | WIPO . |

OTHER PUBLICATIONS

Frederick G. Weiss et al., "A 14-Bit, 1 Gs/s DAC for Direct Digital Synthesis Applications", *IEEE 13th Annual GaAsIC Symposium, Technical Digest*, 1991, pp. 361–364.

*Primary Examiner*—Brian K. Young
*Attorney, Agent, or Firm*—Spencer & Frank

[57] ABSTRACT

A method is provided for linearizing variations in a transfer characteristic of a digital-to-analog (D/A) converter to which a digitized input signal is fed for being converted to an analog output signal. The method includes balancing the D/A converter so that essentially only negative differential variations result in the transfer characteristic at identified locations; determining amplitudes of the negative differential variations; and adding, with an inverse operational sign, the respective amplitudes of the negative differential variations to the input signal of the D/A converter at the respective locations of the variations.

17 Claims, 7 Drawing Sheets

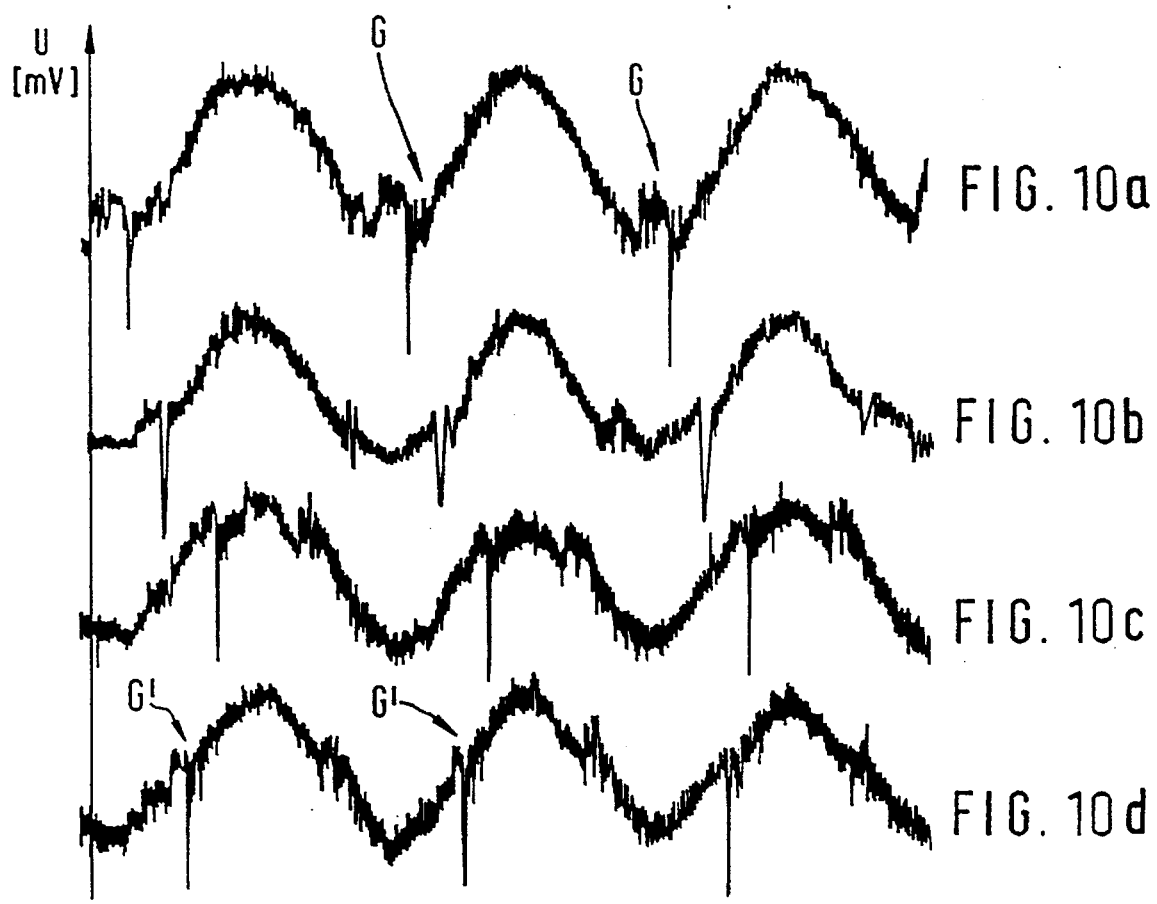
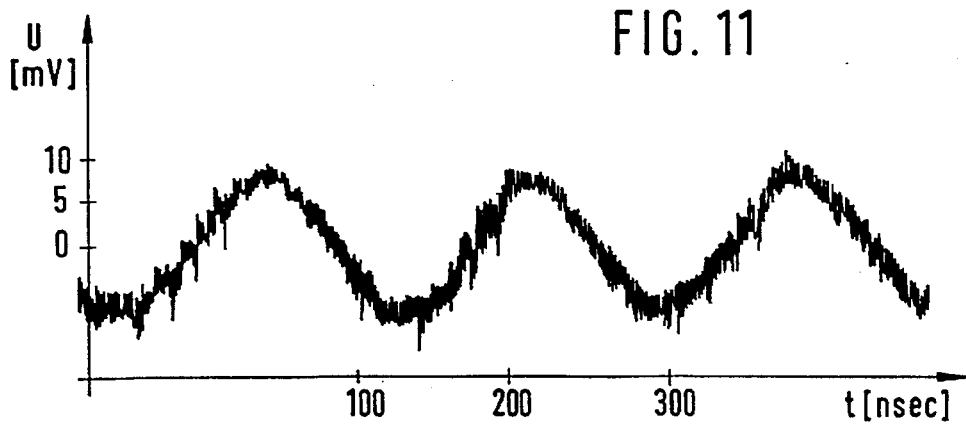

METHOD OF LINEARIZING VARIATIONS IN THE TRANSFER CHARACTERISTIC OF A D/A CONVERTER, AS WELL AS AN ARRANGEMENT AND USE THEREOF

CROSS REFERENCE TO RELATED APPLICATIONS

The present application is related to application No. P 44 08 181.2 filed in Germany on Mar. 11, 1994, the disclosure of which is incorporated herein by reference.

The present application is further related to U.S. application Ser. No. 08/394,450, filed Feb. 27, 1995 (Attorney Docket ANT 1191), the disclosure of which is incorporated herein by reference.

BACKGROUND OF THE INVENTION

The invention relates to a method of linearizing variations in a transfer characteristic of a digital-to-analog (D/A) converter.

Commercial D/A converters exhibit differential variations in their transfer characteristics which result directly from the architecture of the converter. A D/A converter is disclosed by Frederick G. Weiss and Tyler G. Bowman in "A 14-Bit, 1 Gs/s DAC for Direct Digital Synthesis Applications," *IEEE 13th Annual GaAsIC Symposium, Technical Digest* 1991, Monterey, Calif., U.S.A., pp. 361–364, in which the four most significant bits (MSB) are encoded into a so called thermometer code. The least significant bits (LSB) are used in an uncoded state to quantize each segment or range by means of a R2R ladder network. A sum signal is simultaneously determined from weighted current sources and the segmented current sources (or encoded). However, differential variations in the transfer characteristic of the D/A converter occurring due to currents of different intensities in the segments of the thermometer code or the R2R network cannot be compensated in this way. Also, additional errors can result from delay times.

A D/A converter having high linearity is disclosed in WO 90/14717. In this case, errors arising during quantization range switchovers due to tolerances in components or processes are reduced by introducing fixed, predetermined switching thresholds. However, a prerequisite of this solution is at least two D/A converters of different resolution. Also, the converter output signal must undergo an evaluation, which can be skewed. As a result, this compensation scheme does not always function error-free.

A linearization method that likewise presupposes two D/A converters is disclosed in European Patent Application 430 449 A2 wherein a digital random number is summed with each sample of the digital signal and the sum is converted into analog form. The analog counterpart of the random number is subtracted from the analog sum to produce the analog counterpart of the digital signal.

SUMMARY OF THE INVENTION

An object of the present invention is to provide a method of linearizing the transfer characteristic of a D/A converter in which tolerances of weighted current sources of the D/A converter do not have disadvantageous effects.

It is a further object of the invention to provide an arrangement and an application for a D/A converter linearized in this manner.

The above and other objects are accomplished according to the invention by the provision of a method of linearizing variations here in the form of discontinuities in a transfer characteristic of a D/A converter to which a digitized input signal is fed for being converted to an analog output signal, comprising: balancing the D/A converter so that essentially only negative differential variations result in the transfer characteristic at identified locations; determining amplitudes of the negative differential variations; and adding, with an inverse operational sign, the respective amplitudes of the negative differential variations to the input signal of the D/A converter at the respective locations of the variations.

According to a further aspect of the invention there is additionally provided an arrangement for linearizing variations in a transfer characteristic of a D/A converter, comprising: a D/A converter; and a memory disposed upstream of the D/A converter and storing values corresponding to negative differential variations in a transfer characteristic of the D/A converter for subsequent readout and combination with a digital signal input to the D/A converter.

According to yet further aspects of the invention the foregoing method and arrangement are is utilized for converting a digital video signal to an analog signal.

The method according to the invention principally presupposes only one D/A converter for linearization. Signal feedback, as in, for example, the solutions according to EP 447 833 A2 or WO 90/14717 A1, which often cannot be used in very fast D/A converters because of delay problems, is not necessary in this method. The converter input signal can be used in a simple manner as an address signal for activating stored values. Tolerances of the weighted current sources of a D/A converter are individually compensated by stored correction values. Adjustment problems due to mutual dependencies therefore do not occur. In contrast to prior solutions, for example in DE 40 03 682 A1 and WO 90 14 717 A1, that include difference evaluation and signal feedback, the present invention does not present problems with synchronous operation, temperature effects that cannot be compensated or breakdowns. According to the invention, only one D/A converter is necessary to evaluate differential variations. These determined variations are read directly into the memory. The stored values are then only read out as a function of the input signal to be converted. Readjustment, as described, for instance, in DE 40 03 682 A1, is not necessary. Also, there is no time delay dictated by signal feedback.

The method and arrangement according to the invention can also be used without problems in a parallel operation of a plurality of converters in order to increase resolution. Thus, according to a further aspect of the invention, it is possible to additionally suppress systematic errors, e.g., glitches, using linking stages in each parallel branch. All of these measures contribute to the improvement of commercially available D/A converters for extremely high demands, such as processing video or television signal frequency-division multiplex bundles having sampling frequencies in the Gigahertz range, such as described in DE 41 36 112 A1 and DE 40 08 201 C2.

BRIEF DESCRIPTION OF THE DRAWINGS

Embodiments of the invention are described below by way of the drawings.

FIGS. 10a to 10d are signal diagrams of output signals of D/A converter stages operating in parallel and with offset signals staggered with respect to one another.

FIG. 11 is a signal diagram showing the output signal of the D/A converter with reduced systematic error voltages (glitches).

DETAILED DESCRIPTION OF THE PREFERRED EMBODIMENTS

Figure 1:
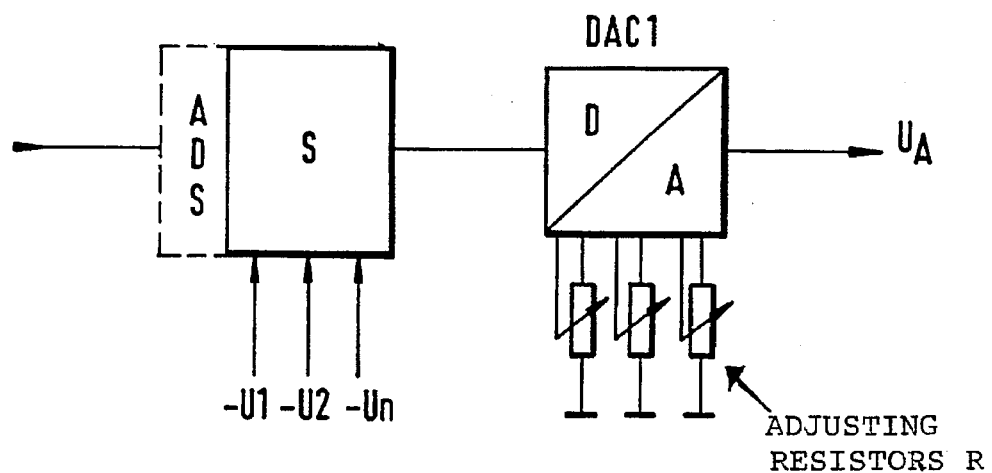
FIG. 1 is a block diagram of an arrangement according to the invention.
Figure 4:
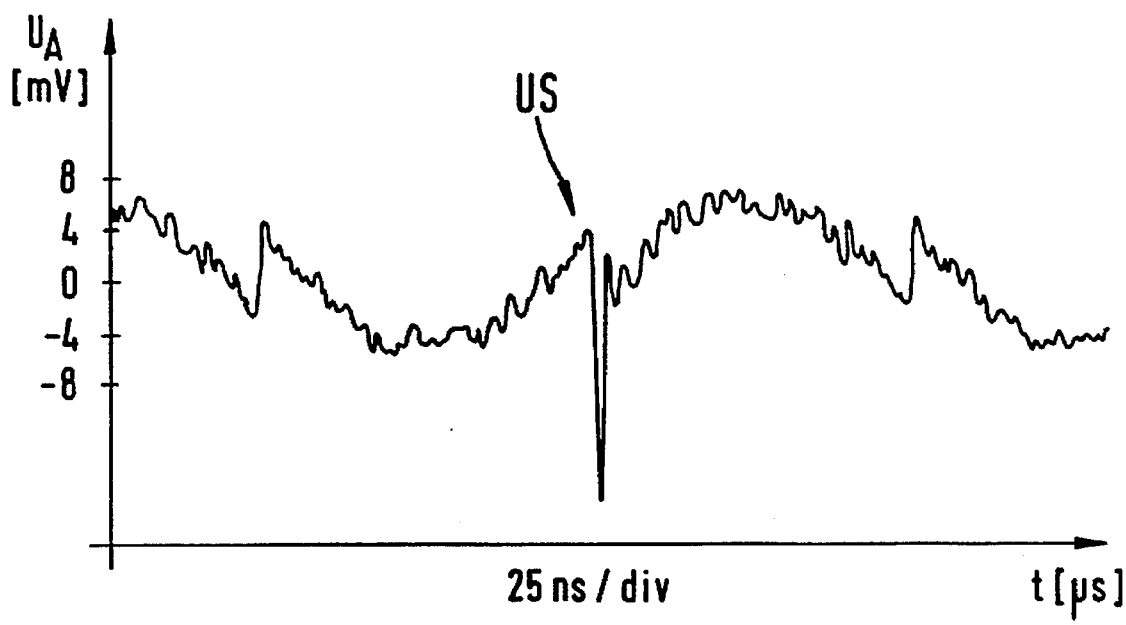
FIG. 4 is a signal diagram showing an analog output signal produced by a D/A converter without employing the measures according to the invention.

Referring to FIG. 1, there is shown an arrangement according to the invention wherein a digital signal, for example a digitized sine signal of 6 MHz having a sampling frequency of 452 MHz and ±8 LSB modulation, is supplied to a D/A converter DAC1 for conversion to an analog signal. FIG. 4 shows the output signal $U_A$ of a commercially-available D/A converter in the absence of the measures according to the invention. Because of the variation US in the transfer characteristic of the D/A converter, which is caused in particular by tolerances in the weighted current sources of the D/A converter, the half-waves of the sine signal are dramatically offset with respect to one another, resulting in a strong harmonic or ripple spectrum.

Figure 7:
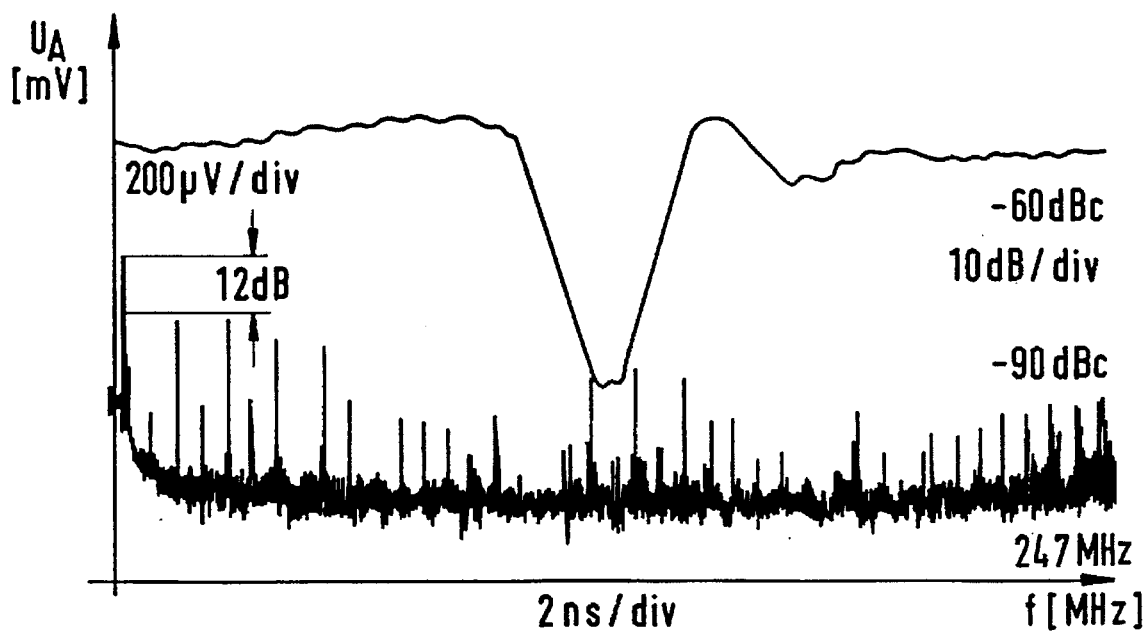
FIGS. 7 and 8 illustrate the signal spectra belonging to the signals shown in FIGS. 4 and 5, respectively.

FIG. 7 shows the signal spectrum at this location of variation, together with the measured output voltage $U_A$, but with higher temporal resolution (2 ns/unit of time measure on the time scale compared to 25 ns/unit of time measure in FIG. 4). As can be seen from the signal spectrum, the harmonics begin at approximately 12 dB below the useful signal (4 mV/div amplitude division). To reduce this skewing of the output signal of the D/A converter, in the method according to the invention, the following measures are taken.

The D/A converter is adjusted, for example as shown in FIG. 1, by the supply of external voltages via externally accessible balancing resistors R, such that only negative differential variations U1, U2, ... Un result in the transfer characteristic (output voltages with respect to input-side digital values).

Figure 2:
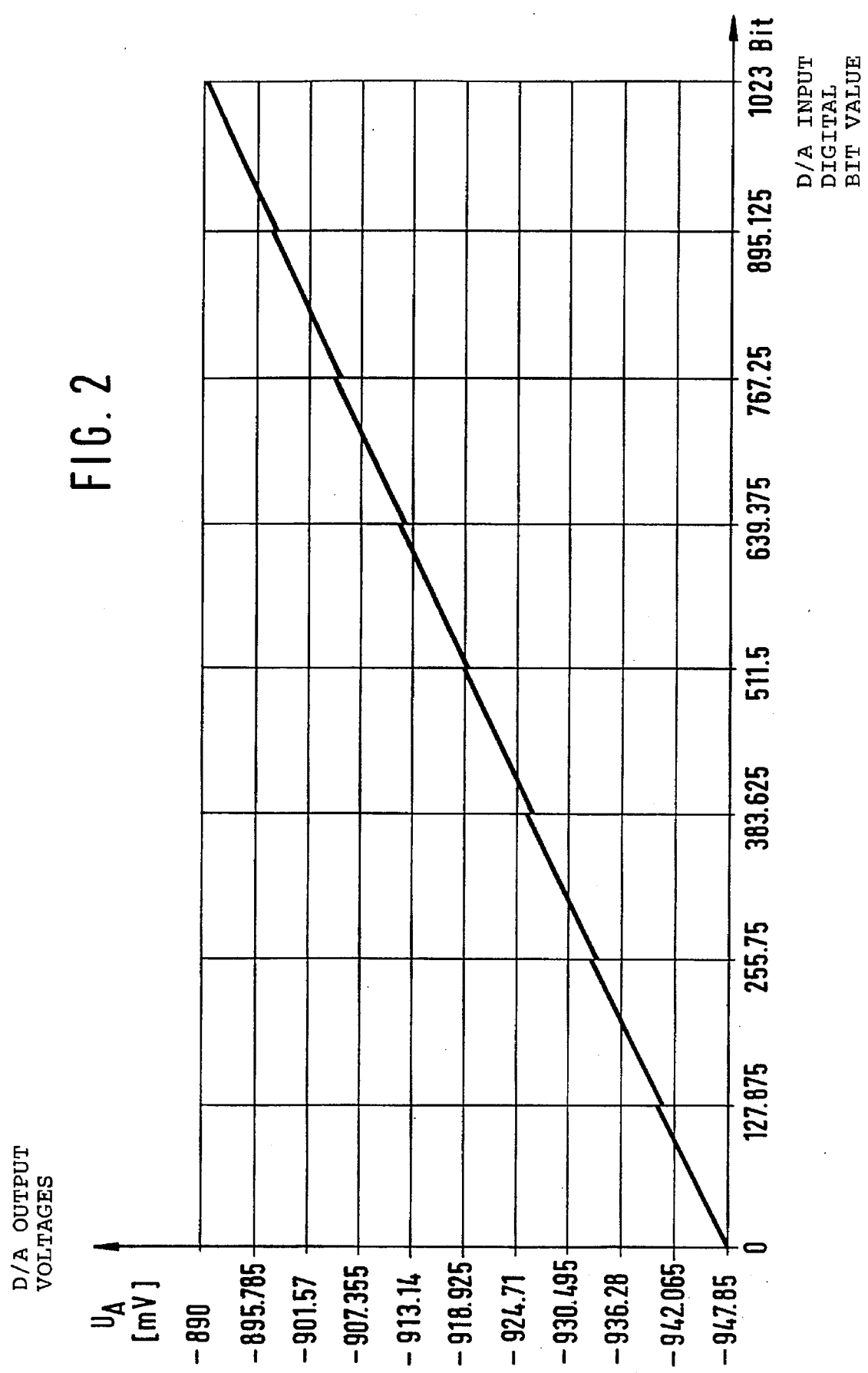
FIG. 2 is a graph representing a transfer characteristic of a D/A converter without the measures of the invention.
Figure 3:
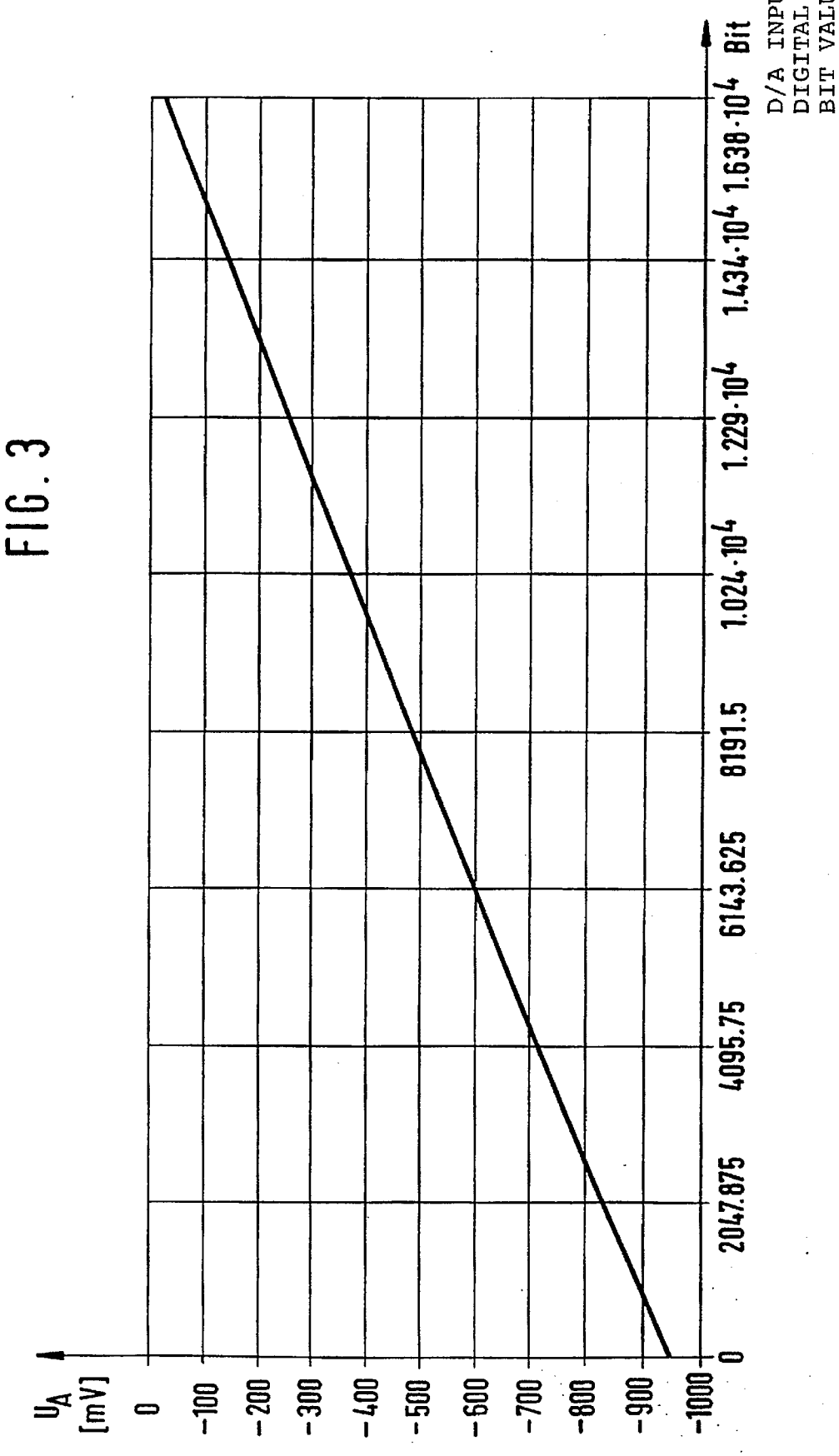
FIG. 3 is graph representing a transfer characteristic of a D/A converter with the measures of the invention.

FIG. 2 shows a transfer characteristic of a D/A converter that only has negative differential variations U1, U2, ... Un following balancing. Depending on the architecture, these variations occur during switching of the weighted constant current sources Q1, Q2, ... Qn of the D/A converter, as can be seen in FIG. 2, at the following transitions of the quantization ranges:

127 to 128 bit value (127.875),
255 to 256 bit value (255.75),
383 to 384 bit value (383.625),
511 to 512 bit value (511.5),
639 to 640 bit value (639.375),
767 to 768 bit value (767.25),
895 to 896 bit value (895.125). Values in paranthesis show the exact position in FIGS. 2 and 3 for reference.

Of course, should a D/A converter inherently have only negative differential variations, such a balancing would not be necessary.

Figure 6:
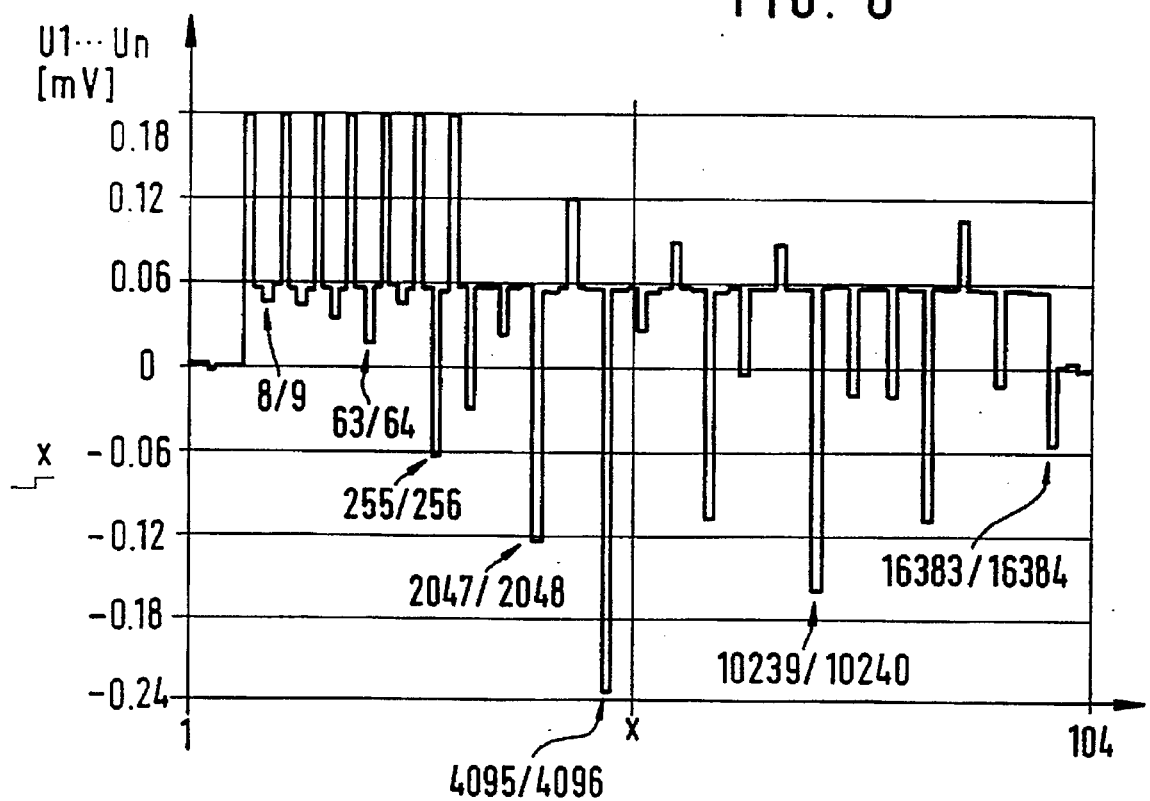
FIG. 6 shows differential nonlinearities of transitions of inherent; e.g. carry transitions or/and thermometer code transitions.

FIG. 6 shows the amplitude values of variations U1, U2, ... Un (major carry differences) for the different quantization range transitions, that is where there is a switch to a further tolerance-afflicted, weighted constant current source. The positive amplitude values of equal height shown on the left are not based on the tolerances of the weighted current sources. Instead, they represent systematic errors, irrelevant for further processing.

The amplitude values of the negative differential variations U1, U2, ... Un are added, with the inverse operational sign, to the input signal of D/A converter DAC1 at the inconsistent locations of the DAC characteristic corresponding to the points of transition for the different quantization ranges (discontinuities). A consistent or discontinuity-free, linearized transfer characteristic shown in FIG. 3 can thus be achieved employing the foregoing measures according to the invention. Note that the characteristic in FIG. 2 relates to only a part of the characteristic shown in FIG. 3.

Figure 5:
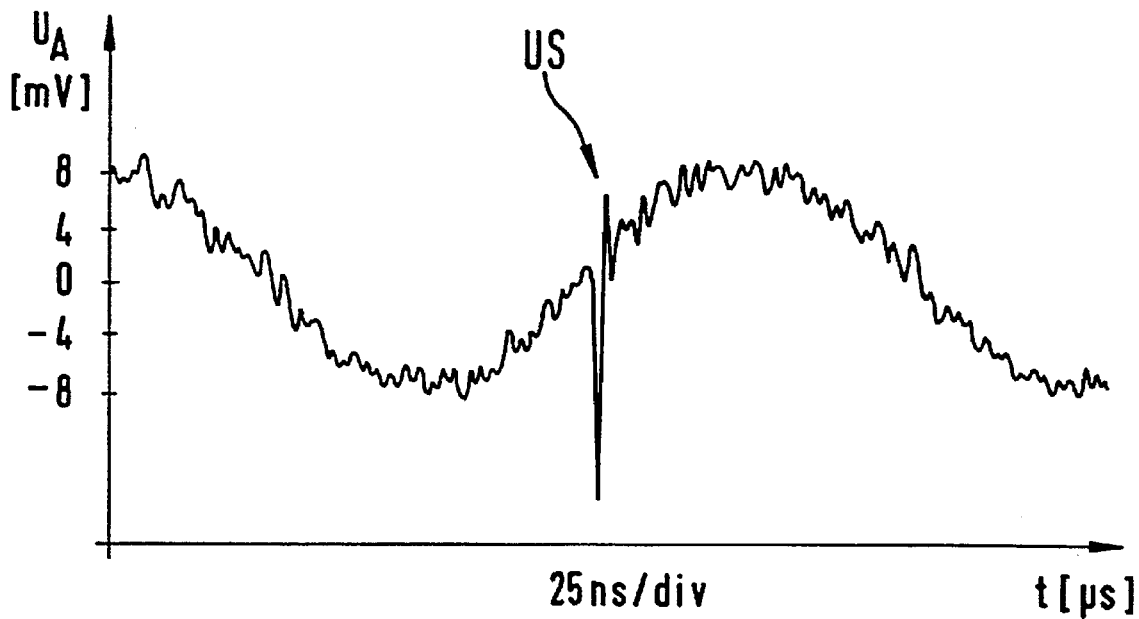
FIG. 5 is signal diagram showing an analog output signal produced by a D/A converter employing the measures according to the invention.
Figure 8:
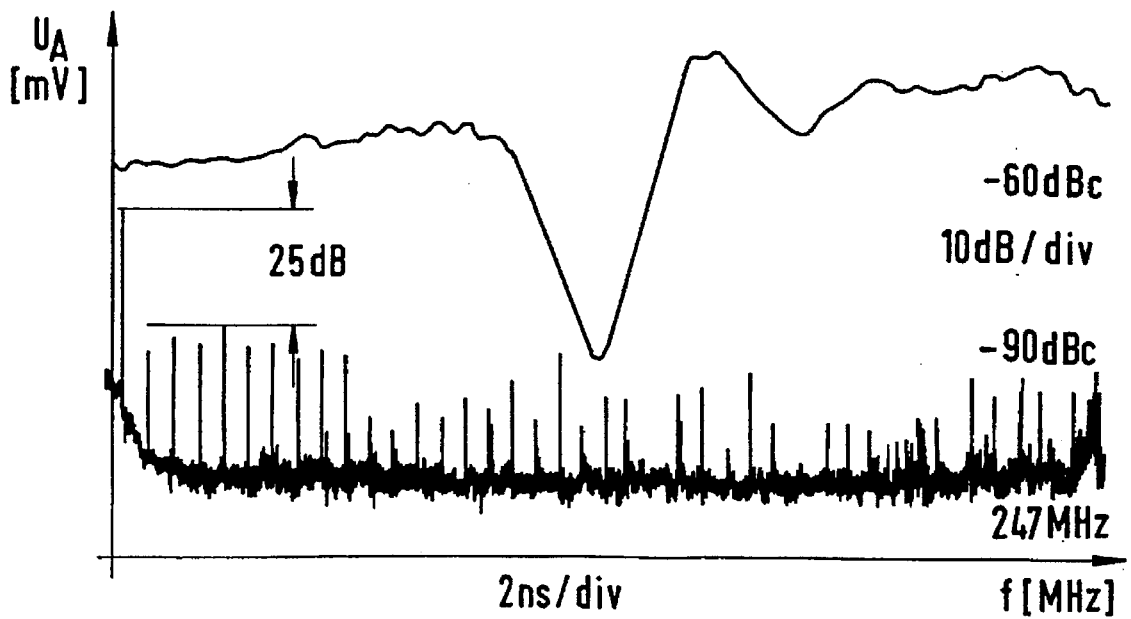

As shown in FIG. 5, utilizing the principles of the invention, the output signal of the D/A converter is no longer offset with respect to the sine half-waves. What remains, however, is the systematic error voltage (glitch), which cannot be reduced until additional measures are taken, as will be explained below. The signal spectrum of FIG. 5 is illustrated in FIG. 8. As can be seen from FIG. 8, the distance of the harmonic components from the useful signal has increased to 25 dB.

Referring again to FIG. 1, a memory S upstream of the input of the D/A converter is particularly suited for the realization of the method of the invention. The determined amplitudes of the negative differential discontinuities U1, U2, ... Un, or values derived therefrom, are read into this memory S with their inverse operational sign. The read-in values are additionally characterized so that readout to D/A converter DAC1 takes place at the respectively associated locations of the variations. In the simplest case, the input signal of the D/A converter is used as memory-address signal which points to the representation value of the pre-equalized DAC characteristic, or converted into one, and the readout of the memory contents is thereby activated. To this end it is useful to equip memory S with an address-control device ADS, which further conducts the stored values to the D/A converter as a function of the quantization of the input signal to be converted. Values corresponding to the weighting coefficients of the constant current sources can also be stored in memory S in a further embodiment of the invention. If the stored values are not stored with their inverse operational signs, subsequent substraction or operational sign inversion can be performed.

Figure 9:
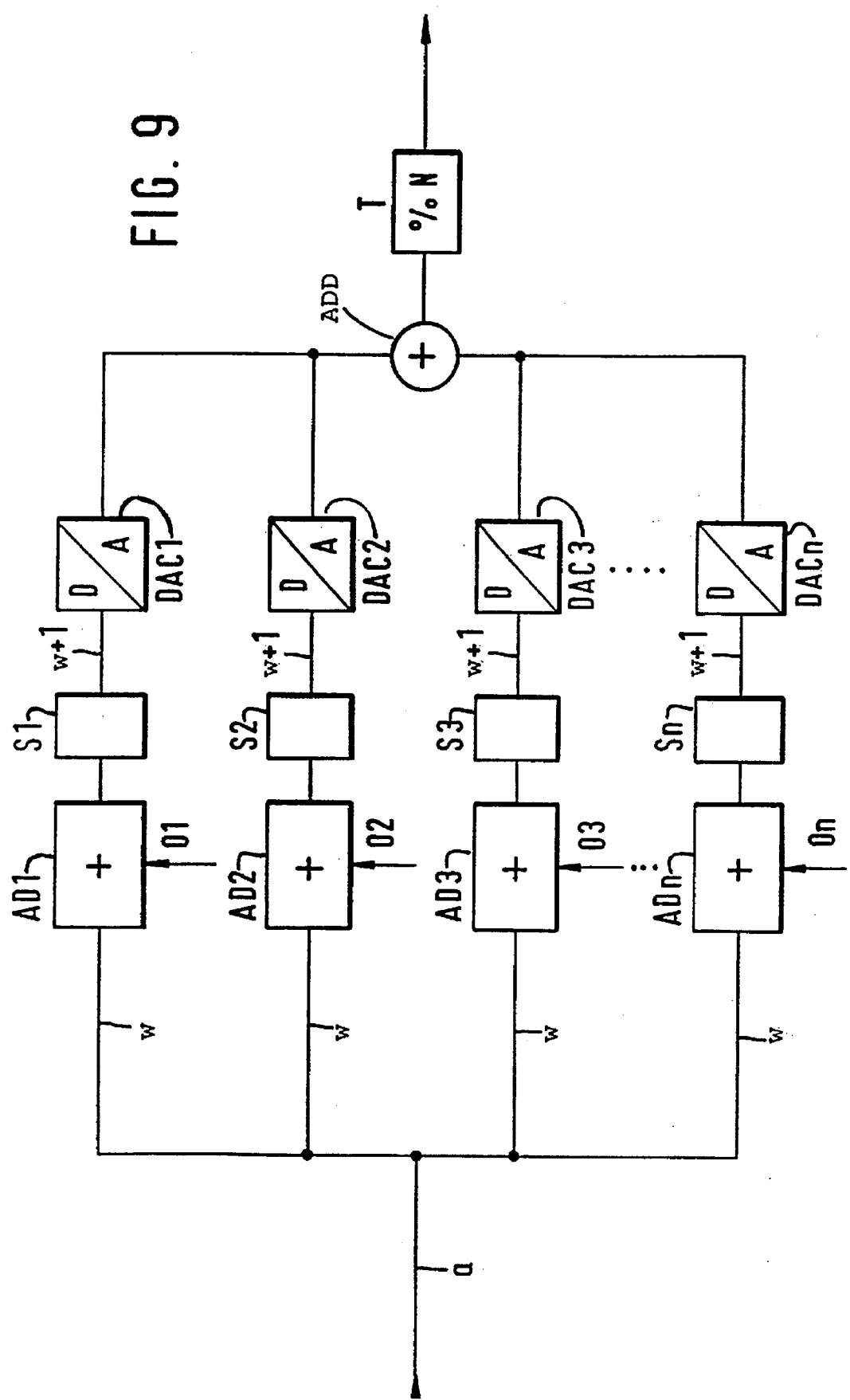
FIG. 9 is a block diagram for a D/A converter according to another embodiment of the invention, with additional suppression of systematic errors.

To increase the resolution of the D/A converter of the invention, a plurality of D/A converter stages can be operated in parallel as shown in FIG. 9. The D/A converter in FIG. 9 comprises n D/A converter stages DAC1, DAC2, DAC3, ... DACn, which are preferably of identical construction, and to which the digital input signal to be converted is supplied in parallel and without interposition of a selection stage for individual quantization groups, the signal having a word width w, for example, of 12 bits. Each of the D/A converter stages DAC1, DAC2, DAC3, ... DACn is allocated a linking stage AD1, AD2, AD3, ... ADn, which is acted upon by an offset O1, O2, O3, ... On, for example a DC voltage value. A respective memory S1, S2, . . . Sn is located upstream of the respective D/A converter stage DAC1, DAC2, . . . DACn, between the respective D/A converter stage and the respective linking stage. Alternating signals having defined spectral lines or pn (pseudo noise) sequences can also be used alternatively as offsets.

These direct voltage offset values differ from converter stage to converter stage. In particular, they are selected e.g. statistically distributed) such that the probability of the occurrence of systematic error voltages, so-called glitches, is minimal. Linking stages AD1, AD2, AD3, . . . ADn are preferably each configured as an adder. Memories S1, S2, . . . Sn can be configured or controlled such that they store the offset values O1, O2, O3, . . . On, and respectively incorporate them with the stored differential variations U1, U2, . . . Un. This alternative eliminates the requirement for separate linking stage; e.g. adders.

Each D/A converter stages DAC1, DAC2, DAC3, . . . DACn is configured such that the word width w+1 to be processed is greater by at least one bit position than word width w of the D/A converter input signal. As an alternative to increasing the word width, the modulation range can also be changed. Because glitches typically occur at certain quantization transitions, depending on the architecture, the direct voltage offset values are varied with respect to one another. The graphs in FIGS. 10a to 10d show a digitized sine signal of 6 MHz which has a sampling frequency of 452 MHz and ±8 LSB modulation, and is acted upon by offset values O1, O2, O3, . . . On.

In FIG. 10a, offset value O1 corresponds to 1031 bits; in FIG. 10b, O2 corresponds to 1027 bits; in FIG. 10c, O3 corresponds to 1019 bits; and in FIG. 10d, O4 corresponds to 1023 bits.

The n output signals of D/A converter stages DAC1, DAC2, DAC3, . . . DACn are preferably combined by means of an adder ADD. The sum signal at the output of adder ADD is subsequently divided, with respect to its output voltage or output current amplitude, by means of a divider T. The divisor N of divider T corresponds to the number n of individual D/A converter stages and is particularly suited as a partial ratio.

The output signal of divider T, i.e., the output signal of the D/A converter, is represented in FIG. 11. It is only skewed slightly by the systematic error voltages of the D/A converter stages, because glitches G or G' are added among themselves, and their amplitude in the signal is lowered by the factor N. A parallel arrangement of D/A converters utilizing offset values to minimize glitches as described above, without the use of memories S1, S2, . . . Sn, is described in Applicants' copending application Ser. No. 08/394,450 filed Feb. 27, 1995 owned by the same assignee as the present application and incorporated herein by reference.

The following occur in particular as systematic errors:
gain and offset errors,
errors in the differential and integral linearity,
dynamic errors (glitches, spikes),
short-time voltage surges.

All of the above errors are reduced by the effect of the measures of the invention on the D/A converter output signal.

In general, it can be said that the gain in the S/N ratio increases by 3 dB each time the number n of converter stages doubles.

The D/A converter of the invention is especially suited for processing digital video signals or television signals, particularly those combined into frequency-division multiplex channel bundles, such as in the method according to DE 41 36 112 or DE 40 08 201 C2.

The D/A converter of the invention is also suited for the production of direct digital signals (direct digital synthesis), for example for digital frequency generators (VFOs) or radar applications, e.g. chirp processing.

The invention has been described in detail with respect to preferred embodiments, and it will now be apparent from the foregoing to those skilled in the art that changes and modifications may be made without departing from the invention in its broader aspects, and the invention, therefore, as defined in the appended claims is intended to cover all such changes and modifications as fall within the true spirit of the invention.

What is claimed is:

1. A method of linearizing variations in a transfer characteristic of a digital-to-analog (D/A) converter to which a digitized input signal is fed for being converted to an analog output signal, comprising:
   adjusting the D/A converter so that essentially only negative differential variations result in the transfer characteristic at identified locations,
   determining amplitudes of the negative differential variations at the locations; and
   adding, with an inverse operational sign, the respective amplitudes of the negative differential variations to the input signal of the D/A converter at the respective locations.

2. A method as defined in claim 1, further including reading into a memory the determined amplitudes of the negative differential variations (U1, U2, . . . Un), or their inverse values, and reading out the memory contents to the D/A converter as a function of the input signal to be converted.

3. A method as defined in claim 1, wherein said reading out step includes using the input signal to be converted as a function of its quantization.

4. A method as defined in claim 2, wherein said reading out step includes converting the input signal into a memory address signal.

5. A method as defined in claim 1, wherein the D/A converter includes weighted current sources having weighting coefficients, and said adjusting step includes adjusting the weighting coefficients so that exclusively negative differential variations result in the transfer characteristic and storing the adjusted weighting coefficients or values derived from the adjusted weighting coefficients.

6. A method as defined in claim 1, and further including storing inverse values of the determined negative differential amplitude variations, and said adding step includes adding the stored inverse values to the input signal of the D/A converter at the respective locations.

7. A method as defined in claim 1, and further including storing the determined negative differential amplitude variations, wherein said adding step includes adding the determined differential amplitude variations to the input signal of the D/A converter at the respective locations after an operation sign inversion has been performed with respect to the respect negative differential amplitude variations.

8. A method of operating a plurality of D/A converters in parallel, including applying the steps of the method according to claim 1 to each of the D/A converters in said plurality of D/A converters.

9. A method as defined in claim 8, and further including applying a different offset value to each of said D/A converters operated in parallel.

10. A method according to claim 9, including selecting the offsets, so that a probability of an occurrence of systematic glitches is minimal.

11. A method according to claim 9, wherein the offsets comprise DC offset voltages, and further including selecting the offsets so that a probability of an occurrence of systematic voltage glitches is minimal.

12. An arrangement for linearizing variations in a transfer characteristic of a digital-to-analog (D/A) converter, comprising:

a D/A converter; and a memory coupled upstream of the D/A converter and storing values corresponding to negative differential variations in a transfer characteristic of the D/A converter for subsequent readout and combination with a digital signal input to the D/A converter.

13. An arrangement as defined in claim 12, wherein said memory includes an address control device for conducting the stored values to the D/A converter as a function of a quantization of the input signal of the D/A converter.

14. An arrangement as defined in claim 12, wherein said D/A converter comprises a plurality of D/A converters connected in parallel for receiving a digital signal input, said memory comprises a plurality of memories each being couple upstream of a respective one of said D/A converters, and further comprising linking stages, each linking stage coupled upstream of a respective one of the D/A converters for acting upon the digital signal input to the D/A converters with respectively different offsets.

15. An arrangement as defined in claim 12, wherein said D/A converter comprises a plurality of D/A converters connected in parallel for receiving a digital signal input, said memory comprises a plurality of memories each disposed upstream of a respective one of the D/A converters, wherein the memories are configured so that the digital signal input to the respective D/A converters is acted upon both by respectively different offsets and by the negative differential variations.

16. A method for converting a digital video signal to an analog signal comprising utilizing the method according to claim 1 to convert the digital video signal to the analog signal.

17. A method for converting a digital video signal to an analog signal, comprising utilizing the arrangement according to claim 12 to convert the digital video signal to the analog signal.

\* \* \* \* \*